United States Patent
Chien

(10) Patent No.: US 10,578,937 B2
(45) Date of Patent: Mar. 3, 2020

(54) METHOD AND APPARATUS OF REPAIRING TRANSISTOR

(71) Applicants: HKC Corporation Limited, Shenzhen (CN); Chongqing HKC Optoelectronics Technology Co., ltd., Chongqing (CN)

(72) Inventor: Chung-Kuang Chien, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 156 days.

(21) Appl. No.: 15/848,654

(22) Filed: Dec. 20, 2017

(65) Prior Publication Data

US 2018/0173065 A1 Jun. 21, 2018

Related U.S. Application Data

(63) Continuation of application No. PCT/CN2017/091656, filed on Jul. 4, 2017.

(30) Foreign Application Priority Data

Dec. 21, 2016 (CN) .......................... 2016 1 1193990

(51) Int. Cl.
   *H01L 21/00* (2006.01)
   *G02F 1/1362* (2006.01)
   *H01L 29/786* (2006.01)
   *H01L 29/66* (2006.01)
   *G09G 3/36* (2006.01)

(52) U.S. Cl.
   CPC .. *G02F 1/136259* (2013.01); *H01L 29/66742* (2013.01); *H01L 29/786* (2013.01); *G02F 2001/136268* (2013.01); *G09G 3/36* (2013.01)

(58) Field of Classification Search
   CPC .. G02F 1/136259; G02F 2001/136268; G09G 3/36; H01L 29/786; H01L 29/66742
   USPC ........................................................ 438/4
   See application file for complete search history.

(56) References Cited

U.S. PATENT DOCUMENTS

| 6,630,976 | B2 * | 10/2003 | Ahn | G02F 1/1368 |
| | | | | 257/59 |
| 7,545,162 | B2 * | 6/2009 | Chung | G02F 1/136259 |
| | | | | 324/754.29 |
| 8,035,058 | B2 * | 10/2011 | Nakasu | B23K 26/34 |
| | | | | 219/121.68 |
| 9,112,187 | B2 * | 8/2015 | Hiraoka | H01L 51/52 |
| 2011/0171757 | A1 * | 7/2011 | Yamamuro | H01L 31/186 |
| | | | | 438/4 |

(Continued)

*Primary Examiner* — Vu A Vu
(74) *Attorney, Agent, or Firm* — WPAT, PC

(57) ABSTRACT

A method of repairing a transistor, for repairing a short-circuit defect of a metal layer between a source and a drain of a thin film transistor; the repairing method including: acquiring a short-circuit region of the metal layer between the source and the drain of the thin film transistor; etching a protective layer located above the short-circuit region with a first wavelength laser; etching the metal layer located in the short-circuit region with a second wavelength laser; and partially etching a channel layer below the short-circuit region with a third wavelength laser.

7 Claims, 3 Drawing Sheets

(56) References Cited

U.S. PATENT DOCUMENTS

2012/0012854 A1* 1/2012 Kaneko ............ G02F 1/136213
257/72

* cited by examiner

METHOD AND APPARATUS OF REPAIRING TRANSISTOR

The present application claims priority to Chinese Patent Application No. 201611193990.0, entitled "Method and Apparatus of Repairing Transistor" of Chinese Patent Office, filed on Dec. 21, 2016, the entire contents of which are hereby incorporated by reference.

TECHNICAL FIELD

The present application relates to the field of liquid crystal display technology, and more particularly to a method and an apparatus of repairing a transistor.

BACKGROUND OF RELATED ART

At present, the common liquid crystal display structure mainly includes an array substrate, a color film substrate and a liquid crystal molecular layer between the two substrates. The array substrate is provided with a plurality of pixel units, each of the pixel cells including a thin film transistor and a pixel electrode. The thin film transistor acts as a switch for controlling the pixel electrode to determine whether the pixel unit can be displayed normally. In the fabrication of the array substrate, the source and the drain of the thin film transistor are formed in a patterning process, but the metal layer between the source and the drain is more likely to cause the short-circuiting of the metal layer channel of the source and the drain due to the poor fabricating process ability. When the metal layer channel of the source and the drain is short-circuited, the conventional short circuit repairing method is to make the pixel as a dark spot. When the dark spots are out of the product specifications, it will cause the product to be scrapped.

SUMMARY

According to embodiments of the present application, a method and an apparatus of repairing a thin film transistor not increase the number of dark dots are provided.

A method of repairing a transistor, is used for repairing a short-circuit defect of a metal layer between a source and a drain of a thin film transistor; the repairing method includes: acquiring a short-circuit region of the metal layer between the source and the drain of the thin film transistor; etching a protective layer located above the short-circuit region with a first wavelength laser, and retaining the metal layer of the short-circuit region; etching the metal layer located in the short-circuit region with a second wavelength laser, and retaining a channel layer below the short-circuit region; and partially etching a channel layer below the short-circuit region with a third wavelength laser.

An apparatus of repairing a transistor, is used for repairing a short-circuit defect of a metal layer between a source and a drain of a thin film transistor; the repairing apparatus includes: an acquiring equipment, for acquiring a short-circuit region of a metal layer between a source and a drain of a thin film transistor; and an etching equipment, for etching the short-circuit region, the etching equipment includes a first laser etching unit being used for etching a protective layer located above the short-circuit region with a first wavelength laser, and for retaining a metal layer of the short-circuit region; a second laser etching unit being used for etching the metal layer located in the short-circuit region with a second wavelength laser, and for retaining a channel layer below the short-circuit region; and third laser etching unit being for partially etching the channel layer located below the short-circuit region with a third wavelength laser.

The details of one or more embodiments of the present invention are set forth in the accompanying drawings and the description below. Other features, objects, and advantages of the present invention will become apparent from the description, the drawings, and the claims.

BRIEF DESCRIPTION OF THE DRAWINGS

In order to illustrate technical schemes of the present invention or the prior art more clearly, the following section briefly introduces drawings used to describe the embodiments and prior art. Obviously, the drawing in the following descriptions is just some embodiments of the present invention. The ordinary person in the related art can acquire the other drawings according to these drawings without offering creative effort.

DETAILED DESCRIPTION OF EMBODIMENTS

For purposes of understanding this application, the present application will be described more fully hereinafter with reference to the accompanying drawings. The preferred embodiments of the present application are given in the accompanying drawings. However, the present application may be embodied in many different forms and is not limited to the embodiments described herein. Rather, the purpose of providing these embodiments is to make the understanding of the disclosure of the present application more thoroughly.

In the fabrication of an array substrate, a source and drain of a transistor such as thin film transistor, are formed in one patterning process. However, the metal layer between the source and the drain easily leads to short circuit of the metal layer channel of the source and the drain because of poor fabrication process ability. The metal layer channel of the source and the drain is also referred to as the second metal layer in the four-mask process of the thin film transistor. The schematic diagram when the second metal layer of the thin film transistor is short-circuited is shown in FIG. 1.

Figure 1:
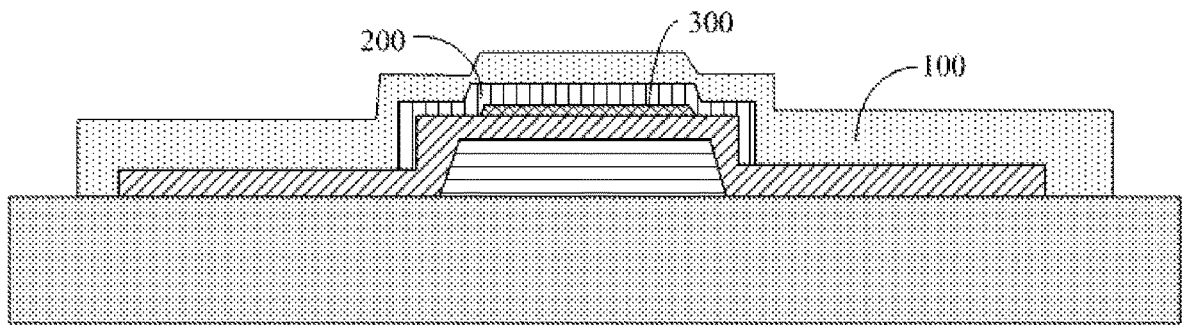
FIG. 1 is a schematic structural view of a thin film transistor in an embodiment, a metal layer between a source and a drain of the thin film transistor is short-circuited.

Referring to FIG. 1, the thin film transistor includes the protective layer 100, the second metal layer 200, and the channel layer 300. The protective layer 100 is used for protecting the internal structure of the thin film transistor, the second metal layer is used for being etched to form the source and the drain, and the channel layer 300 is used as a conductive path of the thin film transistor. As shown in FIG. 1, the second metal layer 200 is in a short-circuited state, so that the thin film transistor does not work normally. The method of repairing the thin film transistor in the present embodiment is for repairing such a thin film transistor in a short-circuited state so that it can be recovered to a normal state.

Figure 2:
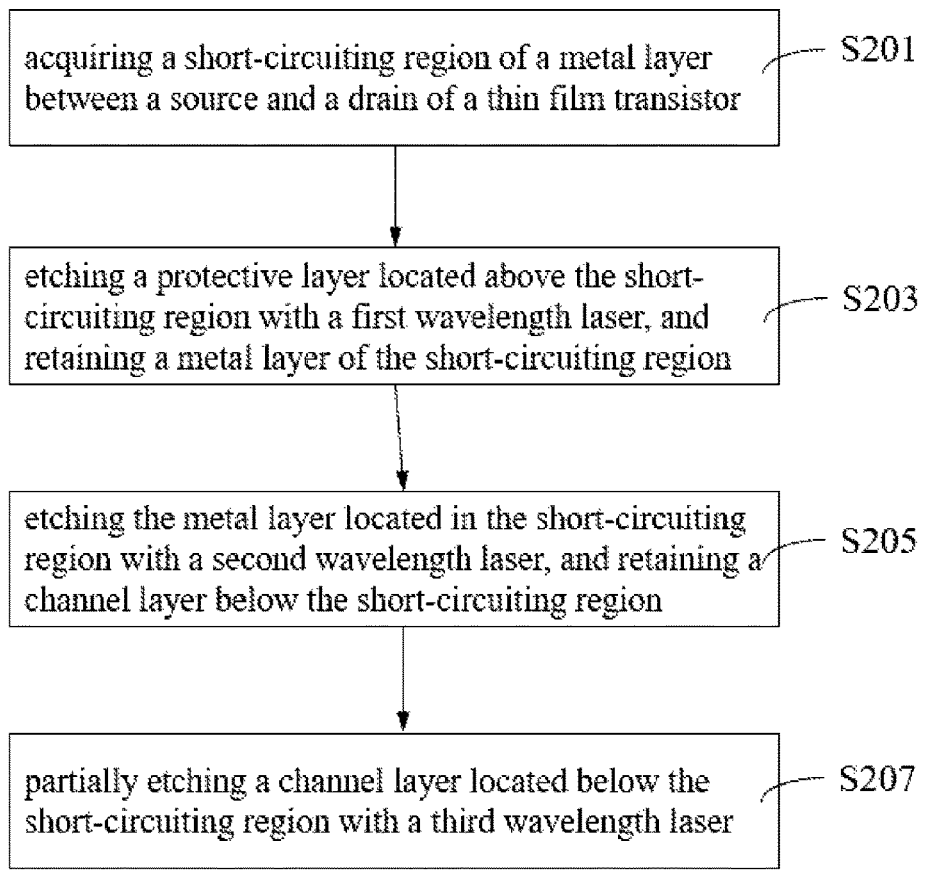
FIG. 2 is a flow chart of a method of repairing a thin film transistor in an embodiment.

FIG. 2 is a flowchart of a method of repairing the thin film transistor in the present embodiment. The method of repairing the thin film transistor is used for repairing the short-circuit defect of the second metal layer 200 between the source and the drain of the thin film transistor, the method includes the steps of:

step S201: acquiring a short-circuit region of a metal layer between a source and a drain of a thin film transistor.

In the present embodiment, the AOI (Automatic Optic Inspection) of the standard process is used for acquiring the short-circuit region of the second metal layer 200 between the source and the drain of the thin film transistor.

Step S203: etching a protective layer located above the short-circuit region with a first wavelength laser, and retaining the metal layer of the short-circuit region.

Figure 3:
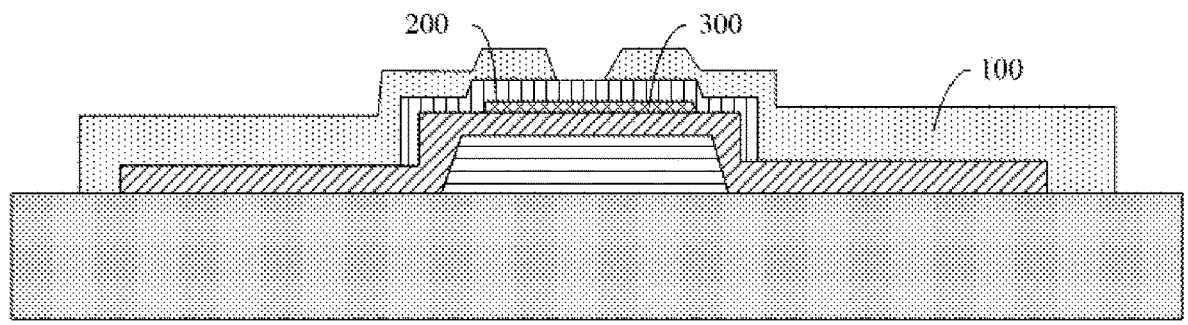
FIG. 3 is a schematic view of a structure of the thin film transistor after the execution of S203 in FIG. 2.

The protective layer 100 on the thin film transistor is a protective layer made by chemical vapor deposition. In the present embodiment, the protective layer 100 above the short-circuit region of the second metal layer 200 between the source and the drain of the thin film transistor is etched by the first wavelength laser, and the first wavelength laser is a laser not causing damage of the second metal layer 200. The wavelength of the first wavelength laser is $\lambda 1$, and $\lambda 1 < 360$ nm. The laser having a wavelength within this range does not cause damage to the second metal layer 200; that is, the second metal layer 200 is not damaged when the protective layer 100 is etched. The first wavelength laser only etches the protective layer 100. FIG. 3 is a schematic view after the execution of S203.

Step S205: etching the metal layer located in the short-circuit region with a second wavelength laser, and retaining a channel layer below the short-circuit region.

Figure 4:
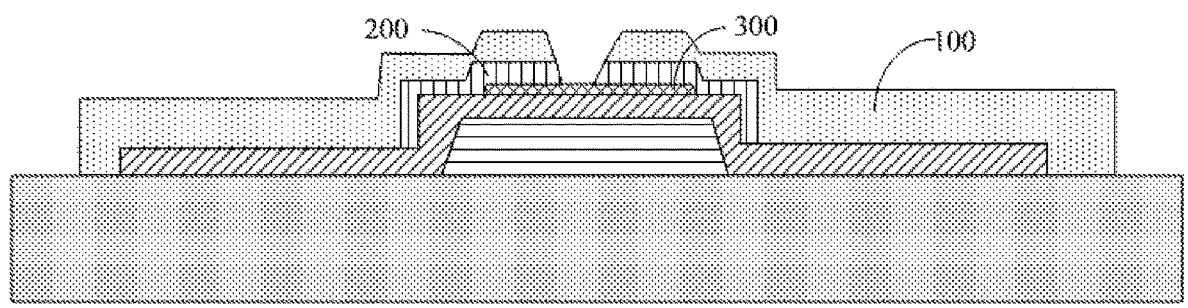
FIG. 4 is a schematic view of a structure of the thin film transistor after the execution of S205 in FIG. 2.

In the present embodiment, the second metal layer 200 between the source and the drain is etched by using the second wavelength laser to form the source and the drain. There is no overlapping region in the wavelength range of the second wavelength laser and the first wavelength laser. The second wavelength laser etches only the second metal layer 200. In the present embodiment, the wavelength of the second wavelength laser is $\lambda 2$, $600$ nm $< \lambda 2 < 1800$ nm. A laser with a wavelength within this range does not cause damage to the channel layer 300. A laser having a wavelength having a high selection ratio for the second metal layer 200 and the channel layer 300 is selected as the second wavelength laser, and the second channel metal layer 200 is etched by the laser without causing damage to the channel layer 300. FIG. 4 is a schematic diagram after execution of S205.

Step S207: partially etching a channel layer below the short-circuit region with a third wavelength laser.

Figure 5:
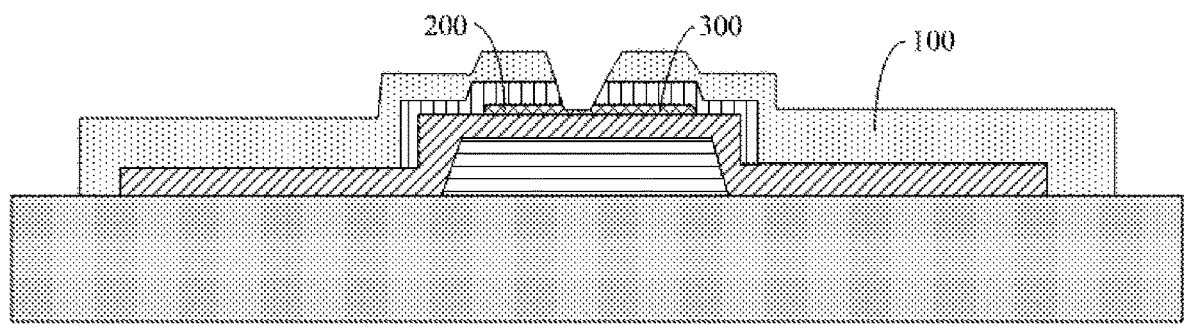
FIG. 5 is a schematic view of a structure of the thin film transistor after the execution of S207 in FIG. 2.

The channel layer 300 acts as a signal of turning on and off in the thin film transistor. The channel layer 300 is a semiconductor layer. The semiconductor layer serves as a channel between the source and the drain of the thin film transistor. In the present embodiment, the channel layer 300 below the short-circuit region of the second metal layer 200 between the source and the drain is partially etched by the third wavelength laser. Only the channel layer 300 is partially etched to ensure the channel characteristics of the channel layer 300, thereby enabling the film transistor to turn on and off the signal. In the present embodiment, the wavelength of the third wavelength laser is $\lambda 3$, $\lambda 3 < 360$ nm. FIG. 5 is a schematic view after the execution of S207. Referring to FIG. 5, the second metal layer 200 of the short-circuit region of the thin film transistor 200 is etched away, while the channel layer 300 is partially etched, thereby ensuring the channel characteristics of the channel layer 300, and then the thin film transistor is recovered to normal thin film transistor structure, so that the thin film transistor does not form a dark spot.

According to the method of repairing the transistor, after acquiring the short-circuit region of the second metal layer 200 between the source and the drain of the thin film transistor, the protective layer 100 is etched by the first wavelength laser, and the first wavelength laser is a laser not causing damage to the metal layer 200. The second metal layer 200 is etched by the second wavelength laser, and the second wavelength laser is a laser not causing damage to the channel layer 300. And the channel layer 300 is partially etched by the third wavelength laser; that is, etching is performed according to the different layers using different wavelengths of laser light, so that the material of the lower layer is not damaged, thereby protecting the lower layer material can be achieved. When the channel layer 300 is etched, the channel layer 300 is only partially etched to retain a portion of the channel layer 300 without interrupting the problematic channel layer 300, thereby the short-circuit defect can be repaired to a normal condition. Therefore, the pixel of the thin film transistor will not become dark, so the number of dark spots of product will not be increased, the product yield can be improved, and the product scrapped can be reduced.

Figure 6:
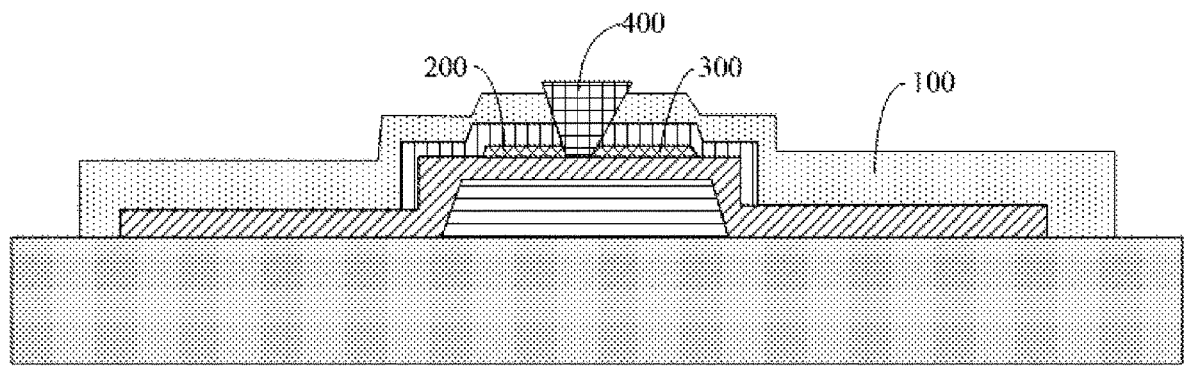
FIG. 6 is a schematic view of a structure of a thin film transistor in FIG. 5 after filling a protective layer in the short-circuit region.

In other embodiments, after the step of S207, the step of filling the protective layer 400 (shown in FIG. 6) at the short-circuit region is also performed. The protective layer 400 may protect the channel layer 300, and may prevent the channel layer 300 from being affected by moisture. The channel layer 300 and the metal layer 200 etched away is filled with the filled protective layer 400. The filled protective layer 400 is an insulating resin. The protective layer 400 is an insulating protective layer to prevent the channel layer 300 from being in the on state and causing the pixel to fail to display black. In one embodiment, the protective layer 400 is a protective layer of a resin material, and the source of the protective layer 400 is simple and inexpensive.

Figure 7:
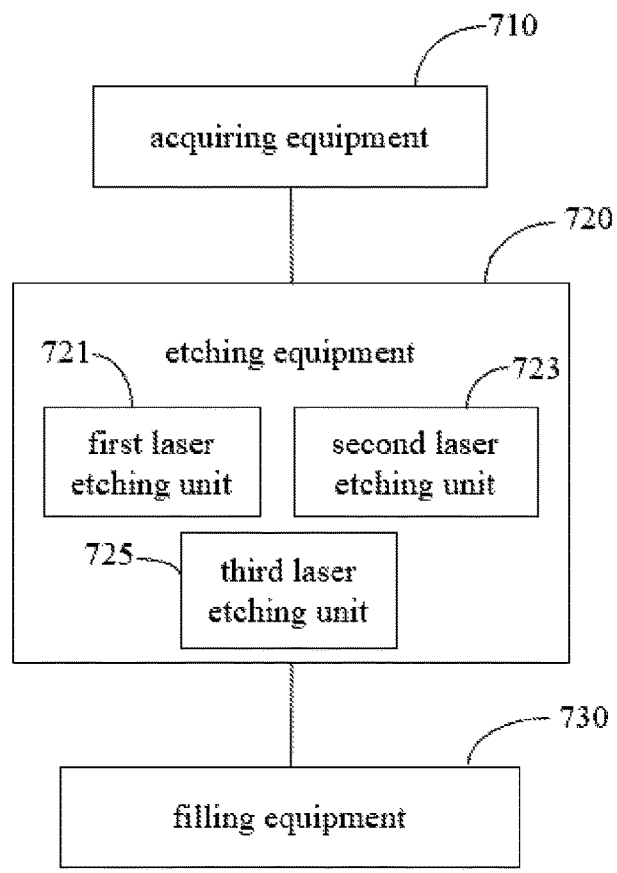
FIG. 7 is a block diagram showing the structure of a repairing apparatus of a thin film transistor according to an embodiment.

FIG. 7 is a block diagram showing the structure of a repairing apparatus of the thin film transistor according to an embodiment. As shown in FIG. 7, the repairing apparatus of the thin film transistor includes an acquiring equipment 710 and an etching equipment 720.

The acquiring equipment 710 is used for acquiring the short-circuit region of the metal layer between the source and the drain of the thin film transistor. In the present embodiment, the acquiring equipment 710 is an automatic optical inspection machine in the standard process. The automatic optical inspection machine detects and acquires the short-circuit region of the second metal layer 200 between the source and the drain of the thin film transistor.

The etching equipment 720 is used for etching the short-circuit region of the metal layer between the source and the drain of the thin film transistor. The etching equipment 720 includes the first laser etching unit 721, the second laser etching unit 723, and the third laser etching unit 725. The first laser etching unit 721 is used for etching the protective layer 100 above the short-circuit region of the second metal layer 200 between the source and the drain of the thin film transistor by the first wavelength laser, and the first wavelength laser does not cause damage to the second metal layer 200. A wavelength having a high selectivity to the protective layer 100 and the second metal layer 200 is selected as the first wavelength laser, and the second metal layer 200 is not damaged when the protective layer 100 is etched. The first wavelength laser only etches the protective layer 100. The second laser etching unit 723 is used for etching the short-circuit metal layer between the source and the drain of the thin film transistor by the second wavelength laser, and the second wavelength laser is a laser not causing damage to the channel layer 300. The second wavelength laser only etches the metal layer between the source and the drain of the thin film transistor. A laser having a wavelength having a high selection ratio for the second metal layer 200 and the channel layer 300 is selected as the second wavelength laser, and the second metal layer 200 is etched without causing damage to the channel layer 300. The third laser etching unit 725 is used for partially etching the channel layer 300 below the short-circuit region of the second metal layer 200 between the source and the drain of the thin film transistor by using the third wavelength laser. In other embodiments, the first laser etching unit 721, the second laser etching unit 723, and the third laser etching unit 724 may be the same laser etching unit. The output laser wavelength of the laser etching unit can be adjusted as necessary to reduce the generation cost.

In other embodiments, the repairing apparatus of the thin film transistor further includes a filling equipment 730. The filling equipment 730 is used for filling the protective layer 400 at the short-circuit region of the metal layer between the source and the drain of the thin film transistor. The protective layer 400 is an insulating protective layer.

According to the apparatus of repairing the transistor, after acquiring the short-circuit region of the second metal layer 200 between the source and the drain of the thin film transistor, the protective layer 100 is etched by the first wavelength laser, and the first wavelength laser is a laser not causing damage to the second metal layer 200. The second metal layer 200 is etched by the second wavelength laser, and the second wavelength laser is a laser not causing damage to the channel layer 300. And the channel layer 300 is partially etched by the third wavelength laser; that is, etching is performed according to the different layers using different wavelengths of laser light, so that the material of the lower layer is not damaged, thereby protecting the lower layer material can be achieved. When the channel layer 300 is etched, only the channel layer 300 is partially etched to retain a portion of the channel layer 300 without interrupting the problematic channel layer 300, thereby fixing the short-circuit defect to a normal condition. Therefore, the pixel of the thin film transistor will not become dark, so the number of dark spots of product will not be increased, the product yield can be improved, and the product scrapped can be reduced.

The technical features of the embodiments described above can be arbitrarily combined, and in order to make the description simple and not to describe all possible combinations of the various technical features in the embodiments, as long as there is no contradiction in the combination of these technical features, it should be considered as the scope of this specification.

Above are only embodiments of the present application, is not patented and therefore limit the scope of the present application, it should be indicated that the present application can also be improved and modified by those skilled in the art without departing from the principle of the present application, and these improvements and modifications also fall within the protection scope of the claims of the present application. Accordingly, the scope of protection of the present application is subject to the scope of protection of the claims.

What is claimed is:

1. A method of repairing a transistor, comprising:
   acquiring a short-circuit region of a metal layer between a source and a drain of a thin film transistor;
   etching a protective layer located above the short-circuit region with a first wavelength laser, and retaining the metal layer of the short-circuit region;
   etching the metal layer located in the short-circuit region with a second wavelength laser, and retaining a channel layer below the short-circuit region; and
   partially etching the channel layer located below the short-circuit region with a third wavelength laser.

2. The method according to claim 1, wherein a wavelength of the first wavelength laser is less than 360 nm, a wavelength range of the second wavelength laser is of 600~1800 nm; and a wavelength of the third wavelength laser is less than 360 nm.

3. The method according to claim 1, wherein the acquired short-circuit region of the metal layer between the source and the drain of the thin film transistor is the short-circuit region of the metal layer between the source and the drain acquired by an automatic optical inspection machine.

4. A method of repairing a transistor, comprising:
   acquiring a short-circuit region of a metal layer between a source and a drain of a thin film transistor;
   etching a protective layer located above the short-circuit region with a first wavelength laser, and retaining a metal layer of the short-circuit region;
   etching the metal layer located in the short-circuit region with a second wavelength laser, and retaining a channel layer below the short-circuit region;
   partially etching a channel layer located below the short-circuit region with a third wavelength laser; and
   filling a protective layer in the short-circuit region.

5. The method according to claim 4, wherein a wavelength of the first wavelength laser is less than 360 nm, a wavelength range of the second wavelength laser is of 600~1800 nm; and a wavelength of the third wavelength laser is less than 360 nm.

6. The method according to claim 4, wherein the acquired short-circuit region of the metal layer between the source and the drain of the thin film transistor is the short-circuit region of the metal layer between the source and the drain acquired by an automatic optical inspection machine.

7. The method according to claim 4, wherein the filled protective layer fills up the etched channel layer and metal layer; and the filled protective layer is an insulating resin.

\* \* \* \* \*